(12) United States Patent
Takahashi et al.

(10) Patent No.: US 6,351,194 B2
(45) Date of Patent: *Feb. 26, 2002

(54) ELECTRONIC COMPONENT UTILIZING FACE-DOWN MOUNTING

(75) Inventors: Yoshiro Takahashi; Kei Nakakuki; Satoshi Itaya; Kayo Hamano, all of Tokyo (JP)

(73) Assignee: Oki Electric Industry Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,086

(22) Filed: Jun. 29, 1998

(30) Foreign Application Priority Data

Jun. 30, 1997 (JP) .............................. 9-174864

(51) Int. Cl.⁷ ............................ H03H 9/72; H05K 7/20; H01L 23/42
(52) U.S. Cl. ................... 333/133; 333/193; 310/313 R; 310/346; 361/704; 361/714; 361/719; 174/262; 257/700; 257/707; 257/712; 257/719
(58) Field of Search .................. 333/133, 193–196; 310/313 R, 346–349, 344; 361/704, 707, 709, 711–720, 722; 174/255, 262; 257/700, 707, 712, 710, 719, 726

(56) References Cited

U.S. PATENT DOCUMENTS

| 4,737,742 A | * | 4/1988 | Takoshima et al. .. 310/313 R X |
| 5,202,652 A | * | 4/1993 | Tabuchi et al. ......... 333/133 X |
| 5,394,011 A | * | 2/1995 | Yamamoto et al. ..... 257/710 X |
| 5,436,411 A | * | 7/1995 | Pasch ........................ 174/261 |
| 5,459,368 A | * | 10/1995 | Onishi et al. ........... 310/313 R |
| 5,471,722 A | * | 12/1995 | Yatsuda .................. 310/344 X |
| 5,561,406 A | * | 10/1996 | Ikata et al. ............. 333/133 X |
| 5,699,027 A | * | 12/1997 | Tsuji et al. .......... 310/313 R X |
| 5,724,729 A | * | 3/1998 | Sherif et al. ............. 257/707 X |
| 5,786,738 A | * | 7/1998 | Ikata et al. ................. 333/133 |
| 5,801,474 A | * | 9/1998 | Sakairi .................... 310/344 X |
| 5,821,161 A | * | 10/1998 | Covell, II et al. ....... 257/704 X |
| 5,901,050 A | * | 5/1999 | Imai ....................... 257/704 X |
| 5,903,820 A | * | 5/1999 | Hagström ................... 455/82 |

FOREIGN PATENT DOCUMENTS

| JP | 63-314858 | | 12/1988 | |
| JP | 4-170811 | * | 6/1992 | ............. 310/313 R |
| JP | 5-129877 | * | 5/1993 | ................. 333/193 |
| JP | 5-160664 | | 6/1993 | |
| JP | 5-167389 | | 7/1993 | |

* cited by examiner

Primary Examiner—Robert Pascal
Assistant Examiner—Barbara Summons
(74) Attorney, Agent, or Firm—Venable; James R. Burdett

(57) ABSTRACT

An electronic component having a multi-layered printed circuit board made of an organic material, a plurality of electronic components mounted in a face-down position on the multi-layered printed circuit board, a metal cover for covering the plurality of electronic components remaining a space or a cavity between the top surface of the printed circuit board and the inner surface of the metal cover having a flange surrounding the outskirts of the metal cover to be adhered to the top surface of the multi-layered printed circuit board, and a heat conductive member packed between the bottom surface of the electronic components, wherein the multi-layered printed circuit board has at least one throughhole vertically penetrating the multi-layered printed circuit board at a location corresponding to the flange and is lined by a metal film, and the multi-layered printed circuit board has a heat conductive layer arranged along the rear surface of the multi-layered printed circuit board, the heat conductive layer being connected to a metal lining of the throughhole.

21 Claims, 5 Drawing Sheets

ELECTRONIC COMPONENT UTILIZING FACE-DOWN MOUNTING

FIELD OF THE INVENTION

This invention relates to a plurality of electronic components each of which has a multi-layered printed circuit board made of a synthetic resin and on which electronic components are mounted in a face-down position. More specifically, this invention relates to an improvement applicable to a structure of electronic components, the structure being appropriate to be employed for a duplexer further employing surface acoustic wave filters.

BACKGROUND OF THE INVENTION AND PRIOR ART STATEMENT

It is well known that employment of a duplexer employing surface acoustic wave filters is effective to make a mobile data communication means more compact and more efficient.

Two independent prior arts including JPA 5-160664 and JPA 5-167389 are available.

The former one, JPA 5-160664, discloses a structure with which a surface acoustic wave filter is mounted on a substrate, albeit the surface acoustic wave filter is not employed to compose a duplexer in this case. In the structure, metal bumps produced on a surface acoustic wave filter are employed to connect the surface acoustic wave filter and each electrode of the wirings produced on a package, as shown in FIG. 5 of JPA 5-160664. This structure has an advantage in which the amount of impedance is less in comparison with the structure in which bonding wires are employed, and therefore it has an advantage in the characteristics in the technical field of the high frequency electric wave transmission and the other advantage effective for the purpose to make the external dimension thereof compact, as well.

The latter one, JPA 5-167389, discloses a duplexer having two independent surface acoustic wave filters each of which has a pass-band different from each other and of which the rear sides are mounted on a package, as shown in FIG. 5 of JPA 5-167389. Bonding wires are employed to bond the terminals of the surface acoustic wave filter and the terminals of the package, which is a ceramic package in this example. The two surface acoustic wave filters are connected in parallel to each other, and they are connected with a common external signal terminal To of the package (Hereinafter referred to as a common electrode.). This common electrode is connected with a first surface acoustic wave filter via a first wiring branched from the common electrode, and incidentally the common electrode is connected with a second surface acoustic wave filter via a second wiring branched from the common electrode and via an impedance matching circuit (M) connected with the second wiring, as shown in FIG. 1 of JPA 5-167389. The impedance matching circuit is a circuit having a function to prevent a signal to be sent toward the common terminal from the first surface acoustic wave filter, from reaching the second surface acoustic wave filter and having the other function to input a signal which is inputted toward the second surface acoustic wave filter from outside via the common terminal, with a high grade of efficiency.

A duplexer is required to have a package in which two surface acoustic wave filters each of which has a pass-band employable for transmitting a signal and the other pass-band employable for receiving the signal, are mounted thereon and is required to have a good magnitude in heat dissipation and hermetic sealing quality. It is needless to emphasize that it is required to have a good grade of the frequency characteristics.

Since the duplexer of JPA 5-167389 has a structure in which the rear surface of a surface acoustic wave filter is mounted in a ceramic package, it has a good quality regarding heat dissipation, because the ceramic package proper has good characteristics in heat dissipation and the duplexer has a large surface with which the ceramic package contacts the surface acoustic wave filter to readily allow the heat generated in the surface acoustic wave filter to be dissipated outward.

It is clear that cost consciousness is important for an electronic component e.g. a duplexer employing one or more surface acoustic wave filters, such as a duplexer being employable for a compact mobile data communication means.

In this sense, review is required for a ceramic package, which is not inherently less expensive. Further, an electronic component e.g. a duplexer having surface acoustic wave filters mounted on a multi-layered printed circuit board made of bis-maleimide triazine resin et al. and which is covered by a hermetically sealed metal cover, is assumed to be required in the industry.

OBJECT AND SUMMARY OF THE INVENTION

Accordingly, an object of this invention is to provide a plurality of electronic components having surface acoustic wave filters mounted in a face-down position on a multi-layered organic printed circuit board and having a metal cover covering the surface acoustic wave filters, wherein the metal cover is hermetically sealed with the circuit board and the heat dissipating characteristics are improved.

To achieve the foregoing object, an electronic component in accordance with a first embodiment of this invention comprises:

a multi-layered printed circuit board made of an organic material, a plurality of electronic components mounted in a face-down position on the multi-layered printed circuit board, a metal cover for covering the plurality of electronic components remaining a space or a cavity between the bottom surface of the electronic components and the inner surface of the metal cover, the metal cover having a flange surrounding the outskirts of the metal cover to be adhered to the top surface of the multi-layered printed circuit board, and a heat conductive member packed between the bottom surface of at least one of the plurality of electronic components and the inner surface of the metal cover, wherein:
the multi-layered printed circuit board has at least one through-hole vertically penetrating the multi-layered printed circuit board at a location corresponding to the flange and being lined by a metal film, and
the multi-layered printed circuit board has a heat conductive layer made of a metal and which is arranged along the rear surface of the multi-layered printed circuit board, the heat conductive layer being connected with the metal film lining the through-hole.

The heat generated in the electronic component in accordance with the first embodiment of this invention is dissipated toward the heat conductive layer via the metal cover and the through-hole. Since the through-hole is arranged to contact the metal flange of the metal cover, the heat is readily dissipated from the metal cover to the heat conductive layer. The heat conductive layer usually contacts an object, e.g. a mother board, on which this electronic component is mounted. These are parameters to make the heat dissipation efficiency better.

The more the quantity of the through-holes is, the better the heat dissipation efficiency is.

It is preferable to bury the internal space of the through-hole with a material having a good grade of heat conductivity, because this is effective to improve the heat dissipation efficiency from the metal cover to the heat conductive layer.

Since an electronic component is required to be compact, it is not easy to allow any area to be employed solely for the purpose of cooling. Therefore, employment of some electrodes as a cooling means as well is a good idea, because this allows some of the areas of an electronic component which areas are not employed for cooling, to be employed for the purpose of cooling. For example, a ground terminal can be preferably employed for a cooling component.

A thermoplastic resin is preferable as a material employable for the heat conductive member, because it is effective to make the stress which is otherwise to be imposed on the electronic component, less.

To achieve the foregoing object, an electronic component in accordance with a second embodiment of this invention comprises:

a multi-layered printed circuit board made of an organic material, a plurality of electronic components mounted in a face-down position on the multi-layered printed circuit board, a metal cover for covering the plurality of electronic components remaining a space or a cavity between the bottom surface of the plurality of electronic components and the inner surface of the metal cover, the metal cover having a flange surrounding the outskirts of the metal cover to be adhered to the top surface of the multi-layered printed circuit board, and a heat conductive member packed between the bottom surface of at least one of the plurality of electronic components, wherein:

the top surface of the multi-layered printed circuit board, which top surface faces the space or the cavity covered by the metal cover, is covered by a metal layer.

In this embodiment, the almost entire internal surface of the space or the cavity confining a plurality of electronic components is covered by a metal layer, resultantly improving the hermetic sealing quality of the space or the cavity confining the surface acoustic wave filters.

The metal layer can be arranged between the layers constituting the multi-layered printed circuit board, in addition to that it is arranged to cover the top surface of the multi-layered printed circuit board.

If some of the through-holes are required to be made to face the space or the cavity in which the surface acoustic wave filters are confined, they are preferably made surface blind through-holes, because a surface blind through-hole is superior in the hermetic sealing quality.

To achieve the foregoing object, an electronic component in accordance with a third embodiment of this invention is a combination of the first and second embodiments.

It is quite natural that the electronic component in accordance with the third embodiment of this invention has both features of the first and second embodiments, to be allowed to enjoy both advantages.

In the case where at least two of the electronic components emit an electromagnetic wave, it is preferable that the heat conductive member is a metal foil bridging the bottom surface of the first surface acoustic wave filter or the transmitting surface acoustic wave filter which generates a larger volume of heat and a selected location of the inner surface of the metal cover, the selected location corresponding to the second surface acoustic wave filter or the receiving surface acoustic wave filter which generates a smaller volume of heat, the metal foil having a U-shaped intermediation of which one end is contacted with one of the edges of the bottom surface of the transmitting surface acoustic wave filter and of which the other end is adhered to the inner surface of the metal cover at a location corresponding to the receiving surface acoustic wave filter, and the U-shaped intermediation having a function to electromagnetically shield the surface acoustic wave filters from each other.

In this case, the metal film has a first function as a heat conductive member and a second function as a shielding member for shielding the electromagnetic waves and a third function to ease stress which otherwise is imposed on the electronic components.

To achieve the foregoing object, an electronic component in accordance with a fourth embodiment of this invention comprises:

a multi-layered printed circuit board further provided with a plurality of insulator layers, each of which is intervened by wirings and/or one or more impedance matching circuits having a strip line structure, a wiring region arranged on a limited area of the top surface of the multi-layered printed circuit board, a couple of surface acoustic wave filters bonded in a face-down position on the wiring region, a plurality of external terminals arranged on the rear surface of the multi-layered printed circuit board, the plurality of external terminals being used for connecting the couple of surface acoustic wave filters, a couple of conductive layers arranged on the remaining areas of the top and rear surfaces of the multi-layered printed circuit board, a common terminal selected from the plurality of external terminals, a first line for connecting the common terminal and one of the surface acoustic wave filters, a second line for connecting the common terminal and the other one of the surface acoustic wave filters via the impedance matching circuit, wherein:

the first line is composed of a blind through-hole, a bonding pad is arranged for connecting the one of the surface acoustic wave filters and the blind through-hole, the bonding pad being arranged in the neighborhood of the blind through-hole, and a first terminal for connecting the bonding pad and a second terminal to be connected to the common terminal.

In this embodiment, the length of the line connecting the terminal of the first surface acoustic wave filter or the transmitting surface acoustic wave filter which terminal is to be employed to connect it with the common electrode, and a diverging point located immediately below the blind through hole, at which diverging point the first line is branched, is made as short as the length of the blind through-hole. It is noted that a shorter distance between the signal transmitting terminal of the first surface acoustic wave filter or the transmitting surface acoustic wave filter and the diverging point at which the first line is branched, is effective to prevent the characteristics of a duplexer composed of the surface acoustic wave filter from deviating from the designated characteristics, because the shorter distance between the signal transmitting terminal of the transmitting surface acoustic wave filter and the diverging point at which the first line is branched, is effective to prohibit reflection of the signal which is being transmitted.

It is further noted that a blind through-hole is effective to improve the hermetic sealing quality.

BRIEF DESCRIPTION OF THE DRAWINGS

This invention, together with its various features and advantages, can readily be understood from the following more detailed description presented in conjunction with the following drawings, in which.

DETAILD DESCRIPTION OF THE PREFERRED EMBODIMENTS OF THIS INVENTION

First Embodiment

An electronic component or a duplexer having a transmitting surface acoustic wave filter and a receiving surface acoustic wave filter both of which are mounted in a face-down position on a multi-layered printed circuit board and having a metal cover covering the surface acoustic wave filters, wherein the surface acoustic wave filters are thermally connected with a heat conductive layer arranged along the rear surface of the multi-layered printed circuit board via through-holes penetrating the multi-layered printed circuit board for the purpose to improve the heat dissipation characteristics and a space or a cavity confining the surface acoustic wave filters is lined by metal layers for the purpose to improve the hermetic sealing quality of the space or of the cavity.

Figure 1:
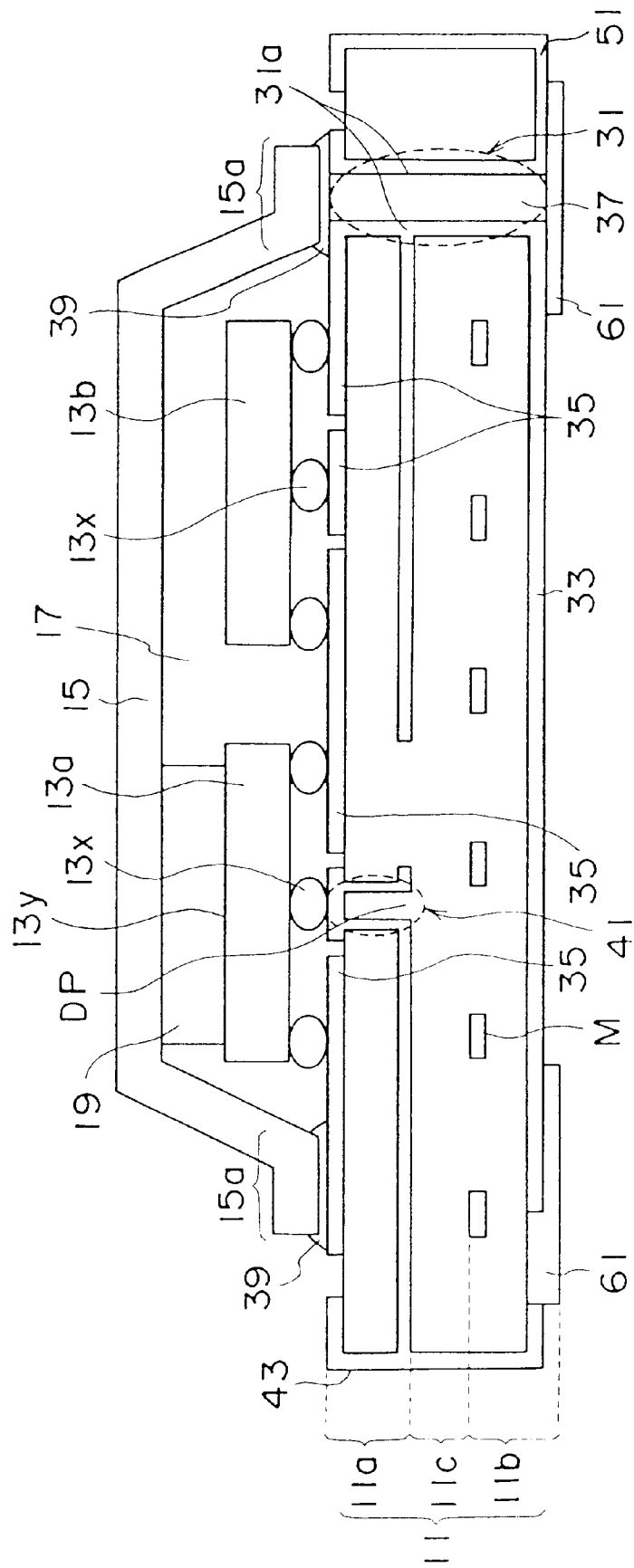
FIG. 1 is a schematic cross section of an electronic component in accordance with the first embodiment of this invention.

Referring to FIG. 1, a first surface acoustic wave filter (13a) and a second surface acoustic wave filter (13b) are mounted in a face-down position on a multi-layered printed circuit board (11) which are covered by a metal cover (15), remaining a space or a cavity (17) between the metal cover (15) and the multi-layered printed circuit board (11). The metal cover (15) has a flange (15a) arranged along the outskirts of the metal cover (15). A heat conductive member (19) is packed between the bottom surface (13y) of the first surface acoustic wave filter (13a) and the inner surface of the metal cover (15).

Each of the surface acoustic wave filters (13a) and (13b) is a surface acoustic wave filter produced by forming at least one interdigital transducer on a piezoelectric substrate. In this specification, the surface of the piezoelectric substrate on which surface the interdigital transducer is formed is named as a top surface, and the surface of the piezoelectric substrate which surface is opposite to the top surface is named as a bottom surface.

The multi-layered printed circuit board (11) is penetrated by at least one through-hole (31) lined by a metal layer (31a), which through-hole (31) is arranged at a location corresponding to the flange (15a) for the purpose to dissipate the heat generated in the surface acoustic wave filters.

The rear surface of the multi-layered printed circuit board (11) is covered by a heat conductive layer (33) which is connected with the through-hole (31). The heat conductive layer (33) can be a ground terminal (51).

The top surface of the multi-layered printed circuit board (11) is covered by metal films (35) as far as possible, insofar as the area facing the space or the cavity (17) is concerned or excluding the area contacting the rear surface of the flange (15a) and the area outside the space or the cavity (17). The function of the metal films (35) is to secure the hermetic sealing quality.

Figure 2:
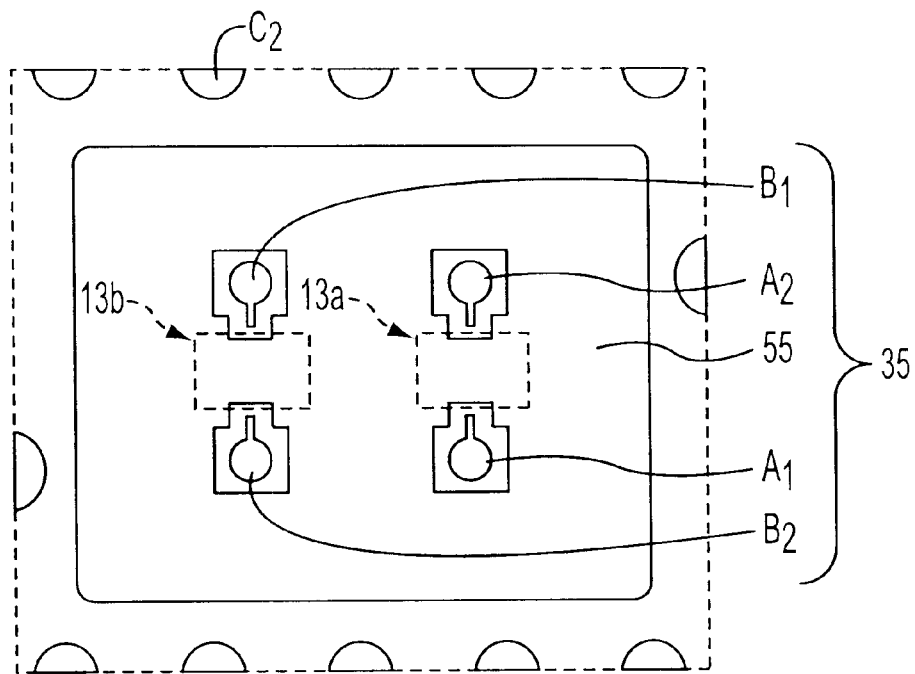
FIG. 2 is a plan view of an upper conductor layer or a fourth layer produced on the upper surface of an upper printed board constituting a multi-layered printed circuit board.

Referring to FIG. 2, the foregoing metal films (35) are composed of mounting terminals $(A_1)$, $(A_2)$, $(B_1)$ and $(B_2)$ and a conductor layer (55) for grounding and which is arranged on the top surface of the multi-layered printed circuit board (11).

Again referring to FIG. 1, the length of the flange (15a) of the metal cover (15) is larger than the inner diameter of the through-hole (31). The through-hole (31) is buried by a thermal conductive material (37) to improve the heat conductivity between the metal cover (15) and the heat conductive layer (33). An adhesive (39) is employed to adhere the flange (15a) of the metal cover (15) and the multi-layered printed circuit board (11).

The multi-layered printed circuit board (11) can be composed of arbitrary two boards. In this embodiment, an upper board (11a) and a lower board (11b) are adhered each other employing a medium layer (11c) produced by preimpregnation. Since the top surface of the upper printed board (11a) and the rear surface of the lower printed board (11b) are covered respectively by a conductor layer, the multi-layered printed circuit board (11) turns out to be composed of four conductive layers. The exemplary material of the conductor layers is copper.

Referring to FIGS. 2, 3, 4 and 5, a description will be presented below for the foregoing four conductor layers.

Figure 3:
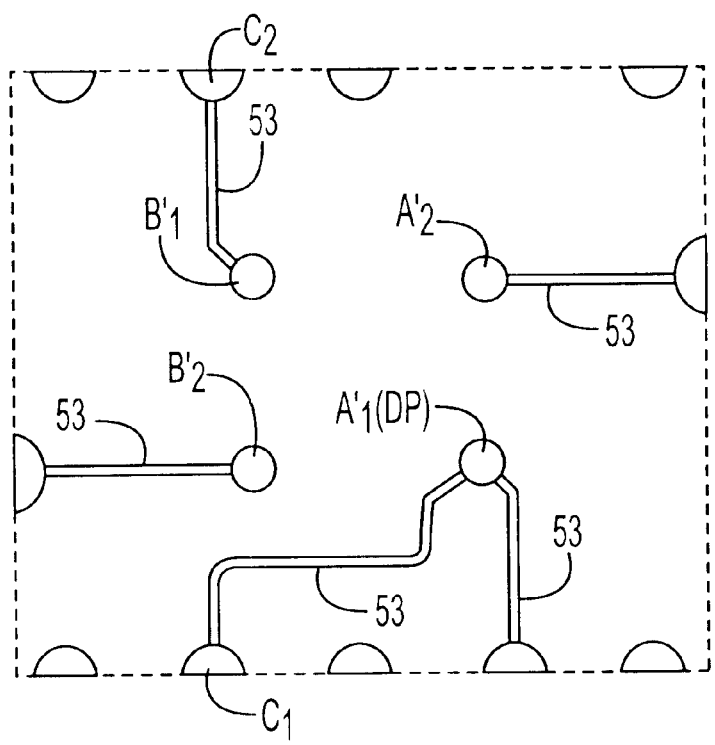
FIG. 3 is a plan view of a lower conductor layer or a third layer produced on the rear surface of the upper printed board constituting the multi-layered printed circuit board.
Figure 4:
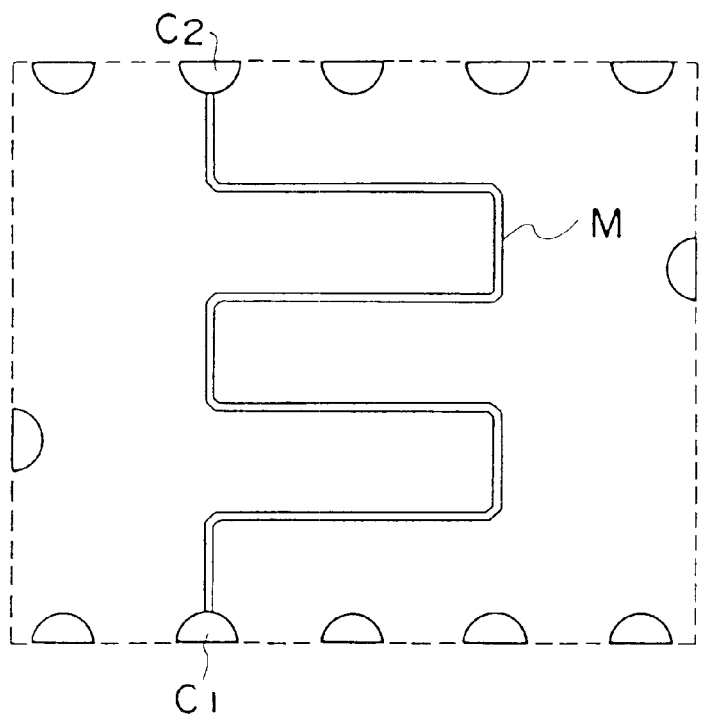
FIG. 4 is a plan view of an upper conductor layer or a second layer produced on the upper surface of the lower printed board constituting the multi-layered printed circuit board.
Figure 5:
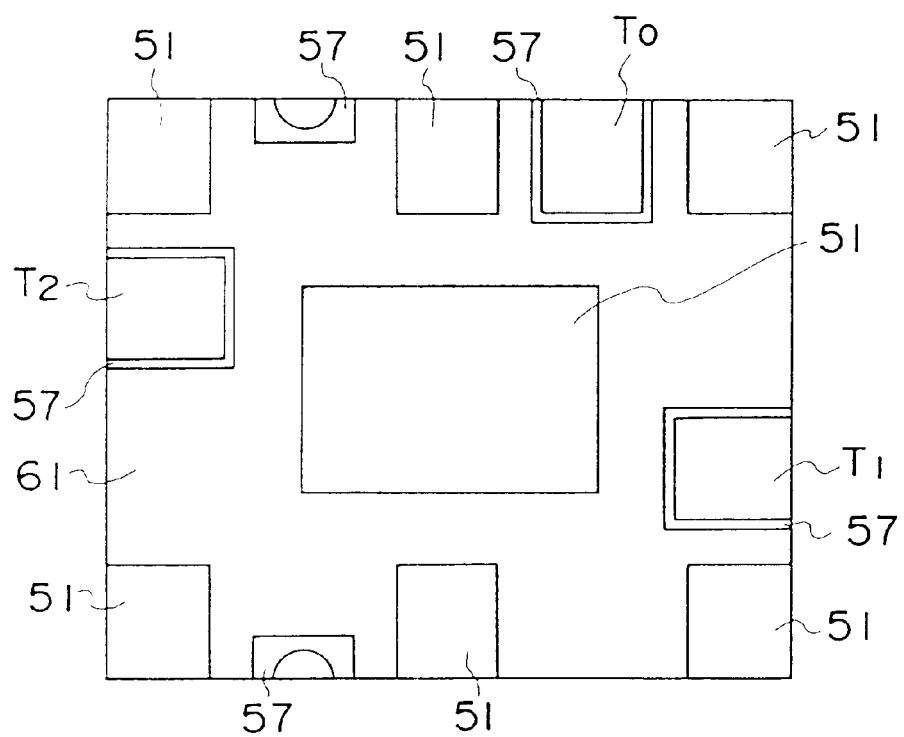
FIG. 5 is a plan view of a rear conductor layer or a first layer produced on the rear surface of the lower printed board constituting the multi-layered printed circuit board.

FIG. 2 is a plan view of an upper conductor layer or a fourth layer produced on the upper surface of the upper printed board constituting a multi-layered printed circuit board. FIG. 3 is a plan view of a lower conductor layer or a third layer produced on the rear surface of the upper printed board constituting a multi-layered printed circuit board. FIG. 4 is a plan view of an upper conductor layer or a second layer produced on the upper surface of the lower printed board constituting a multi-layered printed circuit board. FIG. 5 is a plan view of a rear conductor layer or a first layer produced on the rear surface of the lower printed board constituting a multi-layered printed circuit board.

Referring to FIG. 5, a rear conductor layer or a first layer produced on the rear surface of the lower printed board constituting a multi-layered printed circuit board, is composed of external terminals ($T_0$), ($T_1$), and ($T_2$), and conductor layers for grounding or lower grounding terminals (51), each of which is produced on a layer of a solder resist (61) insulated by insulation gaps (57). The external terminal ($T_0$) is typically connected with an antenna. The external terminal ($T_1$) is employed to receive external signals from outside. The external terminal ($T_2$) is employed to forward received signals toward the circuits of later stages. Since the external terminal ($T_0$) is employed commonly for the first and second surface acoustic wave filters, the external terminal ($T_0$) can be called a common terminal by some chance.

Referring to FIG. 4, an upper conductor layer or a second layer produced on the upper surface of the lower printed board constituting a multi-layered printed circuit board, is a wiring (M) which functions as an impedance matching circuit and which is connected between terminals ($C_1$) and ($C_2$), each of which is produced along the through-holes produced along the side surface of the multi-layered printed circuit board (11).

Referring to FIG. 3, a lower conductor layer or a third layer produced on the rear surface of the upper printed board constituting a multi-layered printed circuit board, has wirings (53) for connecting plural terminals ($A_1'$), ($A_2'$), ($B_1'$) and ($B_2'$) for mounting electronic components.

Referring to FIG. 2, an upper conductor layer or a fourth layer produced on the upper surface of the upper printed board constituting a multi-layered printed circuit board, is composed of terminals ($A_1$), ($A_2$), ($B_1$) and ($B_2$) for mounting surface acoustic wave filters (13a) and (13b), and conductor layers for grounding or upper grounding terminals (55).

Referring to FIGS. 2 through 5, the impedance matching circuit (M) and each of the wirings (53) are made of the strip line structure arranged between the lower grounding terminals (51) and the upper grounding terminals (55).

Referring to FIGS. 1, 3 and 5, the external terminals ($T_0$), ($T_1$), and ($T_2$) and the wirings (53) are connected via semi-cylindrical through-holes (43) produced along the side surface of the multi-layered printed circuit board (11).

Referring to FIGS. 3 and 4, the impedance matching circuit (M) and the wirings (53) are connected as well, via semi-cylindrical through-holes (43) produced along the side surface of the multi-layered printed circuit board (11).

Referring to FIGS. 2 and 3, the terminals ($A_1$), ($A_2$), ($B_1$) and ($B_2$) employable for mounting surface acoustic wave filters and the wirings (53) employable for connecting terminals ($A_1'$), ($A_2'$), ($B_1'$) and ($B_2'$) for mounting electronic components are connected via blind through-holes. A blind through-hole is defined as a through-hole which is lined by a metal layer, which is buried by a product produced employing a lamination process and of which the surface is covered by a conductor layer.

The upper conductor layer (55) for grounding and the lower conductor layer (51) for grounding are connected employing respectively the through-hole (31) and the semi-cylindrical through-hole (43), each of which is explained, referring to FIG. 1.

Referring to FIG. 5, since the conductor layers for grounding or lower ground terminals (51) have a function as heat conductive layers, it is designed to have an area as large as possible, excluding on the area corresponding to the external terminals ($T_0$), ($T_1$), and ($T_2$), the terminals ($C_1$), and ($C_2$) et al. for connecting the semi-cylindrical through-holes (43), and the gap (57) for securing insulation. The remaining area thereof is covered by a layer (61) of a solder resist.

Referring to FIG. 2, surface acoustic wave filters are mounted in a face-down position on the multi-layered printed circuit board (11) employing the terminals ($A_1$), ($A_2$), ($B_1$) and ($B_2$). A structure to mount an electronic component in a face-down position is effective to make an electronic component such as a duplexer employing surface acoustic wave filters, compact, albeit the structure proper is well-known in the industry.

Referring to FIG. 1 again, bumps (13x) are produced on input, output and ground terminals of the surface acoustic wave filters (13a) and (13b). Since it is preferable to employ a non-chemical method therefor, a method to be conducted employing an adhesion process is conducted employing an ultrasonic wave, in this example. Gold is preferably employed as the material for the bumps. Incidentally, it is noted that since an ultrasonic bonding process is employed, no washing process is required after surface acoustic wave filters are mounted on a multi-layered printed circuit board.

From the viewpoints to prevent pyroelectric effect from occurring for surface acoustic wave filters, it is preferable to produce the bumps on the wirings arranged on a multi-layered printed circuit board.

After the bumps (13x) are produced, the surface acoustic wave filters (13a) and (13b) are mounted on the multi-layered printed circuit board (11) employing the terminals ($A_1$), ($A_2$), ($B_1$), ($B_2$) et al. Each of the surface acoustic wave filters is a band-pass filter having respectively a center frequency different from each other. The surface acoustic wave filter employed for transmitting signals has a center frequency of e.g. 836 MHz, and the surface acoustic wave filter employed for receiving signals has a center frequency of e.g. 881 MHz. Each of them has an interdigital transducer produced of an Al alloy on a substrate of e.g. $LiTaO_3$.

Since the multi-layered printed circuit board (11) has the internal wirings described above, each of the surface acoustic wave filters (13a) and (13b) has one terminal connected with the common external terminal ($T_0$) of the duplexer and the other terminal connected with the external signal terminal ($T_1$) in the case of the transmitting surface acoustic wave filter (13a) and the external signal terminal ($T_2$) in the case of the receiving surface acoustic wave filter (13b). The receiving surface acoustic wave filter (13b) is connected with the common external terminal ($T_0$) via the impedance matching circuit (M). In this manner, the requirement for a duplexer is satisfied.

Referring to FIG. 1, the metal cover (15) acts as the heat conductive layer of the transmitting surface acoustic wave filter and as a means for securing hermetic sealing quality of the space or the cavity (17) confining the transmitting and receiving surface acoustic wave filters (13a) and (13b). Since it is preferable that the metal cover (15) has a good grade of electric conductivity and of electromagnetic shielding effect, a press formed basin made of e.g. a Ni layer having a thickness of 0.2 mm can be employed as the metal cover (15).

The flange (15a) of the metal cover (15) can be adhered to the top surface of the multi-layered printed circuit board (11) employing a electrically conductive adhesive, because it has a good grade of thermal conductivity and has a electromagnetic shielding effect, resultantly securing thermal conductivity between the metal cover (15) and the through-hole (31), the hermetic sealing quality for the space or the cavity (17) and the electromagnetic shielding function for the metal cover (15). The electrically conductive adhesive available in the market place usually contains silver. After an electrically conductive adhesive containing silver is employed for adhering the flange (15a) of the metal cover (15) on the top surface of the multi-layered printed circuit board (11), a helium leak test is conducted to ensure the hermetic sealing quality.

A transmitting surface acoustic wave filter usually generates a larger quantity of heat than a receiving surface acoustic wave filter. As a result, arrangement of the heat conductive member (19) between the bottom surface (13y) of the transmitting surface acoustic wave filter (13a) and the inner surface of the metal cover (15) is effective to cool the transmitting surface acoustic wave filter (13a).

The heat conductive member (19) can be made of an adhesive of a thermoplastic resin containing a metal powder e.g. a silver powder or a powder of alumna, a powder of aluminum nitride or a powder of silicon carbide, because it has a good grade of thermal conductivity and a low grade of elasticity, resultantly causing a good result for heat dissipation and low magnitude of stress to be imposed on the connection parts of the bumps et al. Since the distance between the bottom surface (13y) of the transmitting surface acoustic wave filter (13a) and the inner surface of the metal cover (15) is preferably small, it can be selected to be 50 through 75 μm, taking the height and margin thereof of the transmitting surface wave filter (13a) and the dimensional margin of the metal cover (15) into consideration. The bottom surface (13y) transmitting surface acoustic wave filter (13a) and the inner surface of the metal cover (15) can be adhered with an area as large as possible, provided the adhesive does not flow to reach the opposite surface of the transmitting surface acoustic wave filter (13a) on which surface the electrodes are available, because this is effective to reduce the heat resistance.

The through-hole (31) can be buried with an electrically conductive epoxy resin adhesive containing a silver powder, which has a high grade of thermal conductivity.

Since the electronic component in accordance with the first embodiment of this invention is produced as was described above, it is allowed to enjoy the following advantages.

In the case in which the electronic component is employed as a duplexer, the heat generated in the surface acoustic wave filters (13a) and (13b) is transmitted in the following path. The heat generated in the neighborhood of the interdigital transducer of the transmitting surface acoustic wave filter (13a) is transmitted toward the bottom surface (13y) thereof. A part of the heat is transmitted to the metal film (35) of the multi-layered printed circuit board (11) via bumps (13x) (See FIG. 1.). The thermal resistance of the latter path is much larger than that of the former path. Thus, the almost entire quantity of the heat is transmitted to the metal cover (15) via the heat conductive member (19). A part of the heat is dissipated into the air from the surface of the metal cover (15). The remaining quantity of the heat is transmitted to the conductor film (55) arranged on the top surface of the multi-layered printed circuit board (11) (See FIG. 2.) and the heat conductive layer (33) arranged along the rear surface of the multi-layered printed circuit board (11) via the heat conductive adhesive (39) and the thermal conductive material (37) buried in the through-hole (31), before being dissipated into a mother board et al. on which the multi-layered printed circuit board (11) is mounted. A part of the heat is dissipated via the lower grounding terminals (51) surrounded by the solder resist layer (61) arranged along the rear surface of the multi-layered printed circuit board (11) (See FIG. 5).

As a result, the temperature rise of the duplexer package in accordance with the first embodiment of this invention is as low as 12° C. per one watt of the high frequency electric power inputted into the transmitting surface acoustic wave filter (13a), provided the thermal conductivity of the heat conductive member (19) is approximately 30 w/m. k. This level of the temperature rise is less than that of an electronic component which has neither through-holes (31) nor the heat conductive layer (33). Thus, it is clear that the through-hole (31) and the heat conductive layer (33) are effective to cool an electronic component.

No thermal destruction is caused for the interdigital transducers by high frequency electric power of 5 watts inputted into the transmitting surface acoustic wave filter (13a) constituting a duplexer in accordance with the first embodiment of this invention. Further, this power level continuously inputted into an electronic component for 100 hours does not cause any deterioration for the characteristics of the duplexer in accordance with the first embodiment of this invention. In comparison, the interdigital transducers of a surface acoustic wave filter having no heat conductive member (19) is not durable against high frequency electric power of 2 watts, proving the effect of a heat conductive member (19).

Unlike an electronic component packaged in a ceramic package which is inherently superior in the characteristics of the hermetic sealing quality, it is not easy for an electronic component mounted on a multi-layered printed circuit board to secure the hermetic sealing quality. In this embodiment, the space or the cavity confining surface acoustic wave filters therein is surrounded by metal layers as far as possible. On top of that, all the wirings arriving at the space or the cavity (17) in which the surface acoustic wave filters are confined are arranged through blind through-holes. In other words, no penetrating through-holes arrive at the space or the cavity (17) in which the surface acoustic wave filters are confined. As a result, a good grade of hermetic sealing quality is secured for the surface of a multi-layered printed circuit board.

The resistivity of the electrically conductive epoxy resin adhesive containing a metal powder e.g. a silver powder employed for adhering the metal cover to the multi-layered printed circuit board is as low as $2 \times 13^{-3}$ Ωcm after adhesion, in addition to a good grade of the adhesive characteristics.

Finally, a thermal cycling test in which a duplexer in accordance with the first embodiment of this invention is imposed 100 thermal cycles consisting of a cold temperature of 40° C. below zero applicable for 30 minutes and a hot temperature of 85° C. applicable for 30 minutes, followed by a He leakage test, has shown a leakage rate of $1 \times 10^{-8}$ atom·cc/sec, which is the same level as that determined before the thermal cycling test. No corrosion due to a low grade of hermetic sealing quality is recognized for interdigital transducers.

The foregoing description has clarified that the first embodiment of this invention has successfully provided a plurality of electronic components having surface acoustic wave filters mounted in a face-down position on a multi-layered organic printed circuit board and having a metal cover covering the surface acoustic wave filters, wherein the hermetic sealing quality of the metal cover, against the multi-layered printed circuit board and the heat dissipation characteristics are improved to a remarkable extent.

Second Embodiment

An electronic component or a duplexer having a transmitting surface acoustic wave filter and a receiving surface acoustic wave filter both of which are mounted in a face-down position on a multi-layered printed circuit board and having a metal cover covering the surface acoustic wave filters, wherein the surface acoustic wave filters are thermally connected to a heat conductive layer arranged along the rear surface of the multi-layered printed circuit board via through-holes penetrating the multi-layered printed circuit board for the purpose to improve the heat dissipation characteristics, a space or a cavity confining the surface acoustic wave filters is lined by metal layers for the purpose to improve the hermetic sealing quality of the metal cover against the multi-layered printed circuit board, and a metal foil is arranged between the bottom surface (13y) of the transmitting surface acoustic wave filter and the inner surface of a location of the metal cover which location corresponds to the receiving surface acoustic wave filter, the metal foil having U-shaped intermediation of which one end is contacted with one of the edges of the transmitting surface acoustic wave filter and of which the other end is adhered to the inner surface of the metal cover at a location corresponding to the receiving surface acoustic wave filter, for the purpose to enhance the characteristics of the heat dissipation and for the purpose to arrange an electromagnetic shield between the two surface acoustic wave filters.

Figure 7:
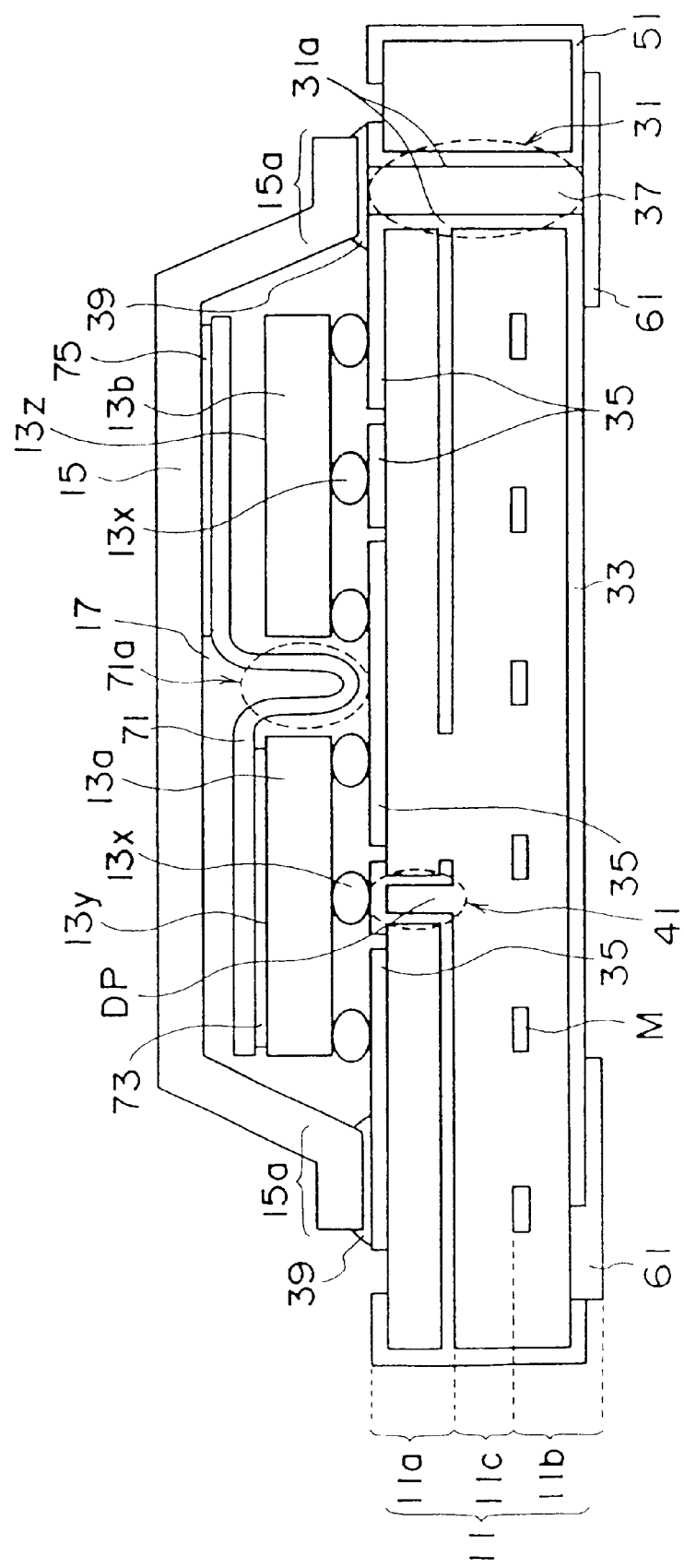
FIG. 7 is a schematic cross section of an electronic component in accordance with the second embodiment of this invention.

Referring to FIG. 7, the electronic component in accordance with the second embodiment of this invention is nearly identical to that in accordance with the first embodiment of this invention, excepting the structure of the heat conductive member (71) which is a metal foil (71) in the second embodiment of this invention.

The metal foil (71) is a foil of a metal e.g. copper which has a good grade of thermal conductivity and is mechanically soft, having a thickness range of 50 through 100 μm. The metal foil (71) has a width larger than that of a surface acoustic wave filter (13a), although it must be allowed to be confined in a space or a cavity (17) confined by a metal cover (15). One end of the metal foil (71) is arranged to cover the bottom surface (13y) of the transmitting surface acoustic wave filter (13a) and the other end of the metal foil (71) is arranged to stick to the inner surface of the metal cover (15) at a location corresponding to the receiving surface acoustic wave filter (13b). Between the two ends, the metal foil (71) has a slack (71a) of which the height is identical to that of the surface acoustic wave filters (13a) or (13b) or slightly less. The slack (71a) is designed to bridge the both ends in a loosened shape. More specifically, the slack (71a) can be described as a U-shaped intermediation of which one end is contacted one of the edges (the right edge in FIG. 7) of the bottom surface (13y) (the top surface in FIG. 7) of the transmitting surface acoustic wave filter (13a) and of which the other end is adhered to the inner surface of the metal cover at a location corresponding to the bottom surface (13z) (the top surface in FIG. 7) of the receiving surface acoustic wave filter (13b).

The one end of the metal foil (71) is adhered to the bottom surface (13y) of the first or transmitting surface acoustic wave filter (13a) employing a first adhesive (73) and the other end of the metal foil (71) is adhered to the inner surface of the metal cover (15) employing a second adhesive (75). The first adhesive (73) is required to be electrically non-conductive and have a good grade of thermal conductivity, because it is harmless even if it flows to reach the opposite surface of the surface acoustic wave filter (13a) on which surface electrodes are available. In this sense, a thermoplastic resin adhesive containing alumina et al. is preferable. A thermoplastic resin adhesive containing a metal powder e.g. a silver powder can be employed for the second adhesive (75).

Adhesives can be applied to the entire bottom surface (13y) of the surface acoustic wave filter (13a) at the foregoing one end of the metal foil (71) and to the entire surface of the metal foil (71) at the foregoing other end of the metal foil (71).

Only one kind of adhesive can be employed both as the first and second adhesives. In this case, however, an attention must be paid not to cause the adhesives to flow to reach the opposite side of the first surface acoustic wave filter (13a) on which side electrodes are available.

The gap between the bottom surface (13y) of the first surface acoustic wave filter (13a) and the inner surface of the metal cover (15) is larger for this embodiment than that for the first embodiment.

The route for heat transmission for this embodiment is identical to that for the first embodiment. Accordingly, the results enjoyable by the first embodiment can be enjoyed by the second embodiment as well.

In the case where a metal foil (71) made of a copper foil having a thickness of 50 μm is employed and an adhesive of which the thermal conductivity is approximately 30 w/m.k is employed as both the first and second adhesives, the temperature rise of the duplexer package in accordance with the second embodiment of this invention is as low as 18° C. per one watt of the high frequency electronic power input into the transmitting surface acoustic wave filter (13a). This level of the temperature rise is less than that of an electronic component which has neither through-holes (31) nor the heat conductive layer (35).

The characteristics regarding the hermetic sealing quality is similar for this embodiment to the first embodiment.

It is noted, however, that the second embodiment has an additional advantage described below. Since one end of the metal foil (71) is adhered the inner surface of the metal cover (15) employing an electrically conductive adhesive (75), and since the flange (15a) of the metal cover (15) is adhered to the upper conductive layer (35) of the multi-layered printed circuit board (11) employing an electrically conductive adhesive (39), the electric potential of the metal foil (71) is the ground potential. Thus, the slack or the U-shaped intermediation (71a) of the metal foil (71) acts as an electromagnetic shield separating the transmitting surface acoustic wave filter (13a) from the receiving surface acoustic wave filter (13b), resultantly preventing a cross talk between the transmitting surface acoustic wave filter (13a) and the receiving surface acoustic wave filter (13b). Further, since the slack or the U-shaped intermediation (71a) of the metal foil (71) has a function to absorb mechanical stress, potential adverse effects to be caused by the metal foil (71) can be remarkably eased.

Third Embodiment

A combination of the first embodiment and the second embodiment.

Fourth Embodiment

An electronic component e.g. a duplexer having a short distance between an input terminal and a transmitting surface acoustic wave filter, whereby being free from drawbacks such as a garble or a deviation of the impedance characteristics, a shift of the phase of signals and/or a reflection of signals in the wiring connecting the input terminal and the transmitting surface acoustic wave filter.

Figure 6:
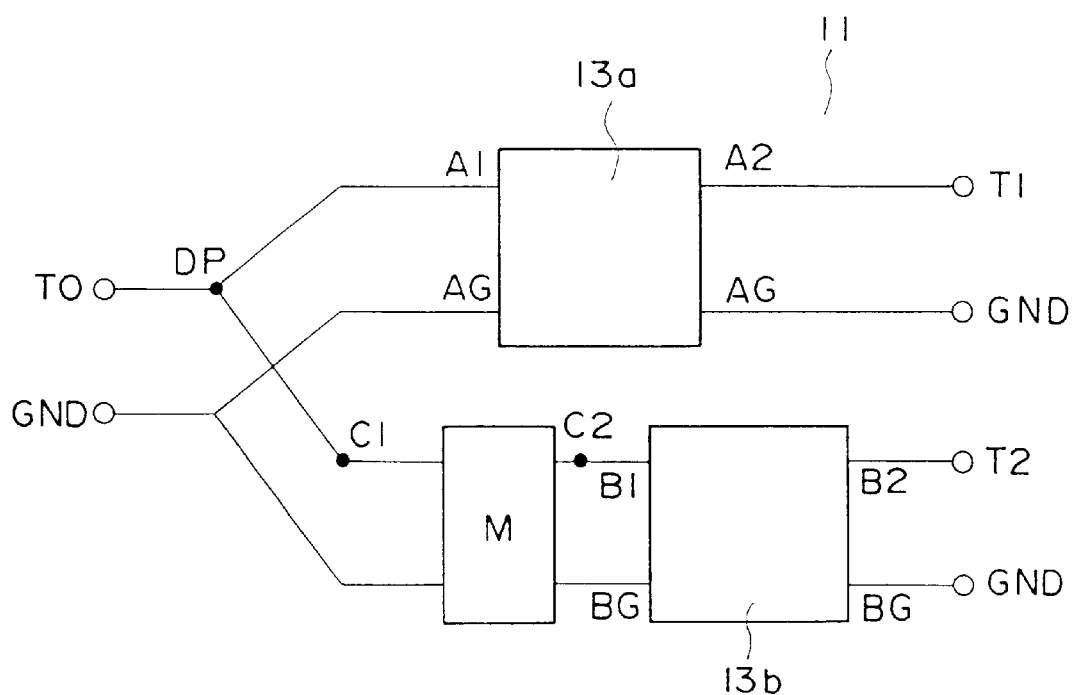
FIG. 6 is a block circuit diagram of a duplexer employing two surface acoustic wave filters.

Referring to FIG. 6, a duplexer consisting of two surface acoustic wave filters each of which has a pass-band different from each other, is composed of a transmitting surface acoustic wave filter (13a) and a series circuit of an impedance matching circuit (M) and a receiving circuit surface acoustic wave filter (13b) which are connected in parallel to each other at a diverging point (DP) with which a common external signal terminal ($T_0$) is connected.

In this sense, if the distance between the diverging point (DP) and an output terminal of the surface acoustic wave filter (13a) which output terminal is employable for transmitting signals, is long, possibilities can not be denied for the impedance characteristics to be garbled or deviated from the designed amount, the phase of signals to be shifted and/or reflection of signals to occur. In other words, such being the case, possibilities can not be denied for the characteristics of a duplexer composed of a surface acoustic wave filter to be deviated from the designed characteristics.

Referring to FIGS. 1 and 2, a blind through-hole (41) is produced to penetrate the upper board (11a) of the multi-layered printed circuit board (11) at a location immediately below the diverging point (DP). Further, a terminal ($A_1$) (See FIG. 2.) employable for mounting the transmitting surface acoustic wave filter (13a) is produced immediately above the blind through-hole (41). An output terminal for transmitting signals of the transmitting surface acoustic wave filter (13a) is mounted on the terminal ($A_1$). This structure causes the length of the wiring (a first line defined in claim 13) connecting the diverging point (DP) and the transmitting surface acoustic wave filter (13a) to be as short as the length of the blind through-hole (41).

Referring to FIGS. 2, 3 and 4, the connection between the diverging point (DP) and the receiving surface acoustic wave filter (13a) is composed of:

the wiring (53) (a second line defined in claim 13) connecting the diverging point (DP) and the terminal ($C_1$) for the end plane through-hole shown in FIG. 3, the impedance matching circuit (M) connecting the terminals ($C_1$) and ($C_2$) shown in FIG. 4, the wiring (53) connecting the terminal ($B_2'$) and the terminal ($C_2$) for the end plane through-hole shown in FIGS. 3 and 4, and a blind through-hole (not shown) connecting the terminal ($B_2'$) and the terminal ($B_2$) (See FIG. 2.).

In the manner described above, the length of the wiring (the first line) connecting the diverging point (DP) and the transmitting surface acoustic wave filter (13a) of the duplexer in accordance with the fourth embodiment of this invention, can be as small as the thickness of the upper board (11a) e.g. 200 through 300 μm. Accordingly, the foregoing drawback which unavoidably accompanies a duplexer bonded with a bonding wire or a duplexer having a long distance between a diverging point and a transmitting surface acoustic wave filter, is successfully removed. In other words, the impedance characteristics are not garbled or deviated from the designed value, the phase of signals is not shifted and/or no reflection occurs for signals in the wiring connecting a diverging point and a transmitting surface acoustic wave filter available in the prior art, is successfully removed. In other words, a deviation of the characteristics of a duplexer composed of a surface acoustic wave filter from the designed characteristics, can be successfully prevented from occurring.

The foregoing description has clarified that this invention has successfully provided a plurality of improvements applicable to electronic components e.g. a duplexer provided with plural surface acoustic wave filters, each of which electronic components is mounted on a multi-layered organic printed circuit board in a face-down position and is covered by a metal cover, the characteristics are improved regarding the hermetic sealing quality of a space or a cavity confined by the printed circuit board and the metal cover, the cooling effect is improved and a potential garble of the characteristics of a duplexer composed of a surface acoustic wave filter or a potential deviation of the characteristics of a duplexer composed of a surface acoustic wave filter from the designed amount is prevented from occurring, potential phase shift for signals is prevented from occurring and potential occurrence of reflection of signals is prevented from occurring.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. An electronic device comprising:
    a multi-layered printed circuit board made of an organic material,
    a plurality of electronic components mounted in a face-down position on said multi-layered printed circuit board, said plurality of electronic components including a duplexer having a transmitting surface acoustic wave filter and a receiving surface acoustic wave filter,
    a metal cover for covering said plurality of electronic components remaining a space or a cavity between the bottom surface of said electronic components and the inner surface of said metal cover, said metal cover having a flange surrounding the outskirts of said metal cover to be adhered to the top surface of said multi-layered printed circuit board, and
    a heat conductive member packed between said bottom surface of at least one of said plurality of electronic components and the inner surface of said metal cover, wherein:
        said multi-layered printed circuit board has at least one through-hole vertically penetrating said multi-layered printed circuit board at a location corresponding to said flange and being lined by a metal film, and
        said multi-layered printed circuit board has a heat conductive layer made of a metal and which is arranged along the rear surface of said multi-layered printed circuit board, said heat conductive layer being connected to said metal film lining said through-hole.

2. An electronic device comprising:

a multi-layered printed circuit board made of an organic material, a plurality of electronic components mounted in a face-down position on said multi-layered printed circuit board, said plurality of electronic components including a duplexer having a transmitting surface acoustic wave filter and a receiving surface acoustic wave filter, and a metal cover for covering said plurality of electronic components while maintaining a space or a cavity between a bottom surface of said electronic components and an inner surface of said metal cover, said metal cover having a flange surrounding the outskirts of said metal cover to be adhered to a surface of said multi-layered printed circuit board, wherein:

almost an entire surface of a top surface of said multi-layered printed circuit board, which top surface faces said space or said cavity covered by said metal cover, is covered by a metal layer, and said receiving surface acoustic wave filter has an unobstructed space between a bottom of said receiving surface acoustic wave filter and said metal cover, and said multi-layered printed circuit board includes at least one through-hole orthogonally penetrating said multi-layer printed circuit board at a location corresponding to said flange, with said through-hole lined by a metal film.

3. An electronic device comprising:

a multi-layered printed circuit board made of an organic material, a plurality of electronic components mounted in a face-down position on said multi-layered printed circuit board, said plurality of electronic components including a duplexer having a transmitting surface acoustic wave filter and a receiving surface acoustic wave filter, a metal cover for covering said plurality of electronic components remaining a space or a cavity between the bottom surface of said electronic components and the inner surface of said metal cover, said metal cover having a flange surrounding the outskirts of said metal cover to be adhered to the surface of said multi-layered printed circuit board, and a heat conductive member packed between said bottom surface of at least one of said plurality of electronic components and the inner surface of said metal cover, wherein:

said multi-layered printed circuit board has at least one through-hole vertically penetrating said multi-layered printed circuit board at a location corresponding to said flange and is lined by a metal film, said multi-layered printed circuit board has a heat conductive layer made of a metal and which is arranged along the rear surface of said multi-layered printed circuit board, said heat conductive layer being connected to a metal lining of said through-hole, and said multi-layered printed circuit board has a metal layer covering almost an entire surface of the top surface of said multi-layered printed circuit board, which top surface faces said space or said cavity covered by said metal cover.

4. An electronic device in accordance with claim 1 or 3, wherein:

said through-hole is buried by a heat conductive material.

5. An electronic device in accordance with claim 1 or 3, wherein:

at least a portion of said heat conductive layer is the terminals of said electronic components.

6. An electronic device in accordance with claim 1 or 3 wherein said receiving surface acoustic wave filter has an unobstructed space between a bottom of said receiving surface acoustic wave filter and said metal cover.

7. An electronic device in accordance with claim 1, or 3, wherein:

said multi-layered printed circuit board has at least one blind through-hole at locations facing said space or said cavity covered by said metal cover.

8. An electronic device in accordance with claim 1 or 3, wherein:

said heat conductive member is made of a heat conductive thermoplastic resin.

9. An electronic device in accordance with claim 1 or 3, wherein:

at least two of said plurality of electronic components emit an electromagnetic wave, and said heat conductive member is a metal foil bridging the bottom surface of one of said electronic components which generates a larger volume of heat and a location of the inner surface of said metal cover, said location corresponding to the other one of said electronic components which generates a smaller volume of heat, and said one of said electromagnetic components and said other one of said electronic components are electromagnetically shielded by the metal foil having a U-shaped intermediation of which one end is contacted with one of the edges of the bottom surface of said one of said electronic components and of which the other end is adhered to the inner surface of said metal cover at a location corresponding to the bottom surface of said other one of said electronic components.

10. An electronic device in accordance with claim 9, wherein:

some of said electronic components emitting an electromagnetic wave are transmitting surface acoustic wave filters and receiving surface acoustic wave filters composing at least one duplexer, and some of said electronic components emitting a larger amount of heat are said transmitting surface acoustic wave filters composing at least one duplexer.

11. An electronic device comprising:

(a) a multi-layered printed circuit board made of an organic material;

(b) at least two electronic components mounted in a face-down position on said multi-layered printed circuit board, one component being for transmission functions in electromagnetic communication of information, and one component being for receiving functions in electromagnetic communication of information;

(c) a metal cover connected to the multi-layered printed circuit board covering the at least two electronic components and forming an enclosed space between the cover and the circuit board, with the electronic components therein; and (d) a heat conduction member disposed in the enclosed space and connected to the cover so as to conduct heat to the cover, and to the component operable for transmission functions in electromagnetic communication of information, the other component being devoid of a connection to the heat conduction member.

12. An electronic device comprising:

a multi-layered printed circuit board made of an organic material, a plurality of electronic components mounted in a face-down position on said multi-layered printed circuit board, said plurality of electronic components including a duplexer having a transmitting surface acoustic wave filter and a receiving surface acoustic wave filter, and a metal cover for covering said plurality of electronic components while maintaining a space or a cavity between a bottom surface of said electronic components and an inner surface of said metal cover, said metal cover having a flange surrounding the outskirts of said metal cover to be adhered to a surface of said multi-layered printed circuit board, wherein:

almost an entire surface of a top surface of said multi-layered printed circuit board, which top surface faces said space or said cavity covered by said metal cover, is covered by a metal layer, and said receiving surface acoustic wave filter has an unobstructed space between a bottom of said receiving surface acoustic wave filter and said metal cover, and said multi-layered printed circuit board has at least one blind through-hole at locations facing said space or said cavity covered by said metal cover.

13. An electronic device comprising:

a multi-layered printed circuit board comprising a plurality of organic layers, each of which is intervened by wirings and/or at least one impedance matching circuit having a strip line structure, a wiring region arranged on a limited area of the top surface of said multi-layered printed circuit board, a first surface acoustic wave filter and a second surface acoustic wave filter attached in a face-down position to said wiring region, a plurality of external connection terminals arranged on the rear surface of said multi-layered printed circuit board, said plurality of external terminals being used for connecting said couple of surface acoustic wave filters, a couple of conductive layers arranged on the remaining areas of the top and rear surfaces of said multi-layered printed circuit board, a common terminal selected from said plurality of external connection terminals, a first line for connecting said first surface acoustic wave filter and a diverging point at which a line from said common terminal is diverged to said first surface acoustic wave filter, a second line diverged at said diverging point from said common terminal and for connecting said second acoustic wave filter and said common terminal, said connection being conducted through said second line and said impedance matching circuit, wherein:

said first line is composed of a blind through hole of which the lower end is immediately connected to said diverging point, and further comprising:

at least one bonding terminal arranged for connecting said transmitting one of said surface acoustic wave filters and the upper end of said blind through hole at a location immediately above said blind through hole or in the neighborhood of said blind through hole, and each of said bonding terminals is connected to a terminal to be connected to said common terminal of said transmitting surface acoustic wave filter.

14. An electronic device in accordance with claim 13, further comprising:

a metal cover for covering said first and second surface acoustic wave filters remaining a space or a cavity between the bottom surface of said surface acoustic wave filters and the top surface of said multi-layered printed circuit board, said metal cover having a flange surrounding the outskirts of said metal cover to be adhered to said top surface of said multi-layered printed circuit board, a heat conductive member packed between the bottom surface of said transmitting one of said surface acoustic wave filters and the inner surface of said metal cover, at least one through-hole vertically penetrating said multi-layered printed circuit board at a location corresponding to said flange and being lined by a metal film, and a heat conductive layer arranged along the rear surface of said multi-layered printed circuit board, said heat conductive layer being connected to the metal lining of said through-hole.

15. An electronic device in accordance with claim 13, wherein:

said first surface acoustic wave filter is a transmitting surface acoustic wave filter, and said second surface acoustic wave filter is a receiving surface acoustic wave filter, and a combination of said transmitting surface acoustic wave filter and said receiving surface acoustic wave filter composes a duplexer.

16. An electronic device comprising:

(a) a multi-layered printed circuit board made of an organic material;

(b) a plurality of electronic components mounted in a face-down position on said multi-layered printed circuit board;

(c) a metal cover for covering said plurality of electronic components remaining a space or a cavity between the bottom surface of said electronic components and the inner surface of said metal cover, said metal cover having a flange surrounding the outskirts of said metal cover to be adhered to the top surface of said multi-layered printed circuit board; and (d) a heat conductive member packed between said bottom surface of at least one of said plurality of electronic components and the inner surface of said metal cover, wherein said multi-layered printed circuit board has at least one through-hole vertically penetrating said multi-layered printed circuit board at a location corresponding to said flange and being lined by a metal film, and said multi-layered printed circuit board has a heat conductive layer made of a metal and which is arranged along the rear surface of said multi-layered printed circuit board, said heat conductive layer being connected to said metal film lining said through-hole, and said multi-layered printed circuit board has at least one blind through-hole at locations facing said space or said cavity covered by said metal cover.

17. An electronic device comprising:

(a) a multi-layered printed circuit board made of an organic material;

(b) a plurality of electronic components mounted in a face-down position on said multi-layered printed circuit board; and (c) a metal cover for covering said plurality of electronic components remaining a space or a cavity between the bottom surface of said electronic components and the inner surface of said metal cover, said metal cover having a flange surrounding the outskirts of said metal cover to be adhered to the surface of said multi-layered printed circuit board, wherein almost an entire surface of the top surface of said multi-layered printed circuit board, which top surface faces said space or said cavity covered by said metal cover, is covered by a metal layer, and said multi-layered printed circuit board has at least one blind through-hole at locations facing said space or said cavity covered by said metal cover.

18. An electronic device comprising:
(a) a multi-layered printed circuit board made of an organic material;
(b) a plurality of electronic components mounted in a face-down position on said multi-layered printed circuit board;
(c) a metal cover for covering said plurality of electronic components remaining a space or a cavity between the bottom surface of said electronic components and the inner surface of said metal cover, said metal cover having a flange surrounding the outskirts of said metal cover to be adhered to the surface of said multi-layered printed circuit board; and
(d) a heat conductive member packed between said bottom surface of at least one of said plurality of electronic components and the inner surface of said metal cover, wherein said multi-layered printed circuit board has at least one through-hole vertically penetrating said multi-layered printed circuit board at a location corresponding to said flange and is lined by a metal film, said multi-layered printed circuit board has a heat conductive layer made of a metal and which is arranged along the rear surface of said multi-layered printed circuit board, said heat conductive layer being connected to a metal lining of said through-hole, said multi-layered printed circuit board has a metal layer covering almost an entire surface of the top surface of said multi-layered printed circuit board, which top surface faces said space or said cavity covered by said metal cover, and said multi-layered printed circuit board has at least one blind through-hole at locations facing said space or said cavity covered by said metal cover.

19. An electronic device comprising:
(a) a multi-layered printed circuit board made of an organic material;
(b) a plurality of electronic components mounted in a face-down position on said multi-layered printed circuit board;
(c) a metal cover for covering said plurality of electronic components remaining a space or a cavity between the bottom surface of said electronic components and the inner surface of said metal cover, said metal cover having a flange surrounding the outskirts of said metal cover to be adhered to the surface of said multi-layered printed circuit board; and
(d) a heat conductive member packed between said bottom surface of at least one of said plurality of electronic components and the inner surface of said metal cover, wherein said multi-layered printed circuit board has at least one through-hole vertically penetrating said multi-layered printed circuit board at a location corresponding to said flange and is lined by a metal film, and said multi-layered printed circuit board has a heat conductive layer made of a metal and which is arranged along the rear surface of said multi-layered printed circuit board, said heat conductive layer being connected to said metal lining of said through-hole, and at least two of said plurality of electronic components emit an electromagnetic wave, and said heat conductive member is a metal foil bridging the bottom surface of one of said electronic components which generates a larger volume of heat and a location of the inner surface of said metal cover, said location corresponding to the other one of said electronic components which generates a smaller volume of heat, and said one of said electronic components and said other one of said electronic components are electromagnetically shielded by the metal foil having a U-shaped intermediation of which one end is contacted with one of the edges of the bottom surface of said one of said electronic components and of which the other end is adhered to the inner surface of said metal cover at a location corresponding to the bottom surface of said other one of said electronic components.

20. An electronic device comprising:
(a) a multi-layered printed circuit board made of an organic material;
(b) a plurality of electronic components mounted in a face-down position on said multi-layered printed circuit board;
(c) a metal cover for covering said plurality of electronic components remaining a space or a cavity between the bottom surface of said electronic components and the inner surface of said metal cover, said metal cover having a flange surrounding the outskirts of said metal cover to be adhered to the surface of said multi-layered printed circuit board; and
(d) a heat conductive member packed between said bottom surface of at least one of said plurality of electronic components and the inner surface of said metal cover, wherein said multi-layered printed circuit board has at least one through-hole vertically penetrating said multi-layered printed circuit board at a location corresponding to said flange and is lined by a metal film, said multi-layered printed circuit board has a heat conductive layer made of a metal and which is arranged along the rear surface of said multi-layered printed circuit board, said heat conductive layer being connected to a metal lining of said through-hole, said multi-layered printed circuit board has a metal layer covering almost an entire surface of the top surface of said multi-layered printed circuit board, which top surface faces said space or said cavity covered by said metal cover, and at least two of said plurality of electronic components emit an electromagnetic wave, and said heat conductive member is a metal foil bridging the bottom surface of one of said electronic components which generates a larger volume of heat and a location of the inner surface of said metal cover, said location corresponding to the other one of said electronic components which generates a smaller volume of heat, and said one of said electronic components and said other one of said electronic components are electromagnetically shielded by the metal foil having a U-shaped intermediation of which one end is contacted with one of the edges of the bottom surface of said one of said electronic components and of which the other end is adhered to the inner surface of said metal cover at a location corresponding to the bottom surface of said other one of said electronic components.

21. An electronic device comprising:
(a) a multi-layered printed circuit board made of an organic material;
(b) a plurality of electronic components mounted in a face-down position on said multi-layered printed circuit board;
(c) a metal cover for covering said plurality of electronic components remaining a space or a cavity between the bottom surface of said electronic components and the inner surface of said metal cover, said metal cover having a flange surrounding the outskirts of said metal cover to be adhered to the surface of said multi-layered printed circuit board, and said multi-layered printed circuit board has at least one blind through-hole at locations facing said space or said cavity covered by said metal cover; and
(d) a heat conduction pathway having opposite ends, one pathway end disposed for receiving heat from said enclosed space, and the other pathway end disposed for transmitting heat to the environment.

* * * * *